United States Patent
Wang et al.

(10) Patent No.: US 9,412,806 B2
(45) Date of Patent: Aug. 9, 2016

(54) MAKING MULTILAYER 3D CAPACITORS USING ARRAYS OF UPSTANDING RODS OR RIDGES

(71) Applicant: Invensas Corporation, San Jose, CA (US)

(72) Inventors: Liang Wang, Milpitas, CA (US); Rajesh Katkar, San Jose, CA (US); Hong Shen, Oak Park, CA (US); Cyprian Emeka Uzoh, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/304,535

(22) Filed: Jun. 13, 2014

(65) Prior Publication Data

US 2015/0364538 A1    Dec. 17, 2015

(51) Int. Cl.
*H01L 27/01* (2006.01)
*H01L 49/02* (2006.01)

(52) U.S. Cl.
CPC ................ *H01L 28/90* (2013.01); *H01L 28/65* (2013.01)

(58) Field of Classification Search
CPC ............................................ H01L 28/40–28/92
See application file for complete search history.

(56) References Cited

U.S. PATENT DOCUMENTS

| | | | |
|---|---|---|---|
| 3,894,872 A | 7/1975 | Mitchell, Jr. et al. | |
| 5,532,519 A | 7/1996 | Bertin et al. | |
| 5,599,744 A | 2/1997 | Koh et al. | |
| 5,701,233 A | 12/1997 | Carson et al. | |
| 6,157,076 A | 12/2000 | Azotea et al. | |
| 6,222,722 B1 | 4/2001 | Fukuzumi et al. | |
| 6,251,796 B1 | 6/2001 | Abdul-Ridha et al. | |
| 6,259,128 B1 | 7/2001 | Adler et al. | |
| 6,322,903 B1 | 11/2001 | Siniaguine et al. | |
| 6,384,473 B1 | 5/2002 | Peterson et al. | |
| 6,403,444 B2 | 6/2002 | Fukuzumi et al. | |
| 6,451,650 B1 | 9/2002 | Lou | |
| 6,492,726 B1 | 12/2002 | Quek et al. | |
| 6,498,381 B2 | 12/2002 | Halahan et al. | |

(Continued)

FOREIGN PATENT DOCUMENTS

| EP | 1688994 B1 | 8/2008 |
|---|---|---|
| EP | 2546876 A1 | 1/2013 |

(Continued)

OTHER PUBLICATIONS

ChipScale Review, "The Impact of CSPs on Encapsulation Materials," ChipScale Review publication issue Mar. 1998, retrieved Feb. 21, 2014, 6 pages.

(Continued)

*Primary Examiner* — Bryan Junge
(74) *Attorney, Agent, or Firm* — Haynes and Boone, LLP

(57) ABSTRACT

In one embodiment, a method for making a 3D Metal-Insulator-Metal (MIM) capacitor includes providing a substrate having a surface, forming an array of upstanding rods or ridges on the surface, depositing a first layer of an electroconductor on the surface and the array of rods or ridges, coating the first electroconductive layer with a layer of a dielectric, and depositing a second layer of an electroconductor on the dielectric layer. In some embodiments, the array of rods or ridges can be made of a photoresist material, and in others, can comprise bonded wires.

15 Claims, 9 Drawing Sheets

(56) References Cited

U.S. PATENT DOCUMENTS

| | | |
|---|---|---|
| 6,559,499 B1 | 5/2003 | Alers et al. |
| 6,613,672 B1 | 9/2003 | Wang et al. |
| 6,620,701 B2 | 9/2003 | Ning |
| 6,624,505 B2 | 9/2003 | Badehi |
| 6,717,254 B2 | 4/2004 | Siniaguine |
| 6,746,876 B2 | 6/2004 | Itoh et al. |
| 6,787,916 B2 | 9/2004 | Halahan |
| 6,847,077 B2 | 1/2005 | Thomas et al. |
| 6,947,275 B1 | 9/2005 | Anderson et al. |
| 6,958,285 B2 | 10/2005 | Siniaguine |
| 7,011,988 B2 | 3/2006 | Forcier |
| 7,049,170 B2 | 5/2006 | Savastiouk et al. |
| 7,061,102 B2 | 6/2006 | Eghan et al. |
| 7,115,988 B1 | 10/2006 | Hool |
| 7,144,745 B2 | 12/2006 | Badehi |
| 7,183,643 B2 | 2/2007 | Gibson et al. |
| 7,400,036 B2 | 7/2008 | Tan |
| 7,510,928 B2 | 3/2009 | Savastiouk et al. |
| 7,557,037 B2 | 7/2009 | Sunohara |
| 7,670,921 B2 | 3/2010 | Chinthakindi et al. |
| 7,793,414 B2 | 9/2010 | Haba et al. |
| 7,839,622 B2 | 11/2010 | Matters-Kammerer |
| 7,851,321 B2 | 12/2010 | Clevenger et al. |
| 7,897,454 B2 | 3/2011 | Wang et al. |
| 7,906,803 B2* | 3/2011 | Shioya .................. B82Y 10/00 257/296 |
| 7,928,548 B2 | 4/2011 | Bernstein et al. |
| 7,977,579 B2 | 7/2011 | Bathan et al. |
| 7,989,270 B2 | 8/2011 | Huang et al. |
| 8,071,470 B2 | 12/2011 | Khor et al. |
| 8,072,082 B2 | 12/2011 | Yean et al. |
| 8,076,788 B2 | 12/2011 | Haba et al. |
| 8,085,524 B2 | 12/2011 | Roozeboom et al. |
| 8,102,039 B2 | 1/2012 | Noma et al. |
| 8,110,862 B2 | 2/2012 | Cheng et al. |
| 8,283,750 B2 | 10/2012 | Guiraud et al. |
| 8,294,240 B2 | 10/2012 | Nowak et al. |
| 8,298,906 B2 | 10/2012 | Bernstein et al. |
| 8,298,944 B1 | 10/2012 | West |
| 8,373,252 B1 | 2/2013 | DeBaets |
| 8,377,829 B2 | 2/2013 | Yeh et al. |
| 8,378,480 B2 | 2/2013 | Chen et al. |
| 8,397,013 B1 | 3/2013 | Rosenband et al. |
| 8,404,520 B1 | 3/2013 | Chau et al. |
| 8,426,961 B2 | 4/2013 | Shih et al. |
| 8,470,668 B2 | 6/2013 | Cho et al. |
| 8,518,753 B2 | 8/2013 | Wu et al. |
| 8,519,537 B2 | 8/2013 | Jeng et al. |
| 8,552,485 B2 | 10/2013 | Chang et al. |
| 8,558,345 B2 | 10/2013 | Kim et al. |
| 8,575,760 B2 | 11/2013 | Phee et al. |
| 8,598,695 B2 | 12/2013 | Oganesian et al. |
| 8,618,651 B1 | 12/2013 | Yee |
| 8,642,393 B1 | 2/2014 | Yu et al. |
| 8,673,775 B2 | 3/2014 | Chiou et al. |
| 8,674,423 B2 | 3/2014 | Collins et al. |
| 8,697,567 B2 | 4/2014 | Henderson et al. |
| 8,748,284 B2 | 6/2014 | Tzeng et al. |
| 8,785,289 B2 | 7/2014 | Kim et al. |
| 8,802,494 B2 | 8/2014 | Lee et al. |
| 8,841,185 B2 | 9/2014 | Khakifirooz et al. |
| 8,890,316 B2 | 11/2014 | Henderson et al. |
| 8,895,385 B2 | 11/2014 | Chang et al. |
| 9,165,793 B1 | 10/2015 | Wang et al. |
| 2003/0100189 A1* | 5/2003 | Lee ........................ B82Y 10/00 438/694 |
| 2004/0183187 A1 | 9/2004 | Yamasaki et al. |
| 2004/0201111 A1 | 10/2004 | Thurgood |
| 2005/0047094 A1 | 3/2005 | Hsu |
| 2005/0196095 A1 | 9/2005 | Karashima et al. |
| 2005/0219788 A1* | 10/2005 | Chow ...................... H01G 4/005 361/305 |
| 2005/0263869 A1 | 12/2005 | Tanaka et al. |
| 2005/0266701 A1 | 12/2005 | Aoyagi |
| 2006/0097378 A1 | 5/2006 | Yamano |
| 2006/0214262 A1* | 9/2006 | Mosley ................... H01G 4/08 257/532 |
| 2006/0231900 A1 | 10/2006 | Lee et al. |
| 2007/0029654 A1 | 2/2007 | Sunohara et al. |
| 2007/0045798 A1 | 3/2007 | Horie |
| 2007/0111430 A1* | 5/2007 | Chudzik ............. H01L 23/5223 438/252 |
| 2007/0117337 A1 | 5/2007 | Chen et al. |
| 2007/0212845 A1 | 9/2007 | Lin et al. |
| 2007/0235850 A1 | 10/2007 | Gerber et al. |
| 2008/0019077 A1 | 1/2008 | Coolbaugh et al. |
| 2008/0089007 A1 | 4/2008 | Oladeji et al. |
| 2008/0113505 A1 | 5/2008 | Sparks et al. |
| 2008/0128897 A1 | 6/2008 | Chao |
| 2008/0157159 A1* | 7/2008 | Hook ..................... H01L 29/945 257/312 |
| 2008/0197399 A1* | 8/2008 | Hsu ....................... B82Y 10/00 257/307 |
| 2008/0244902 A1 | 10/2008 | Blackwell |
| 2009/0115047 A1 | 5/2009 | Haba et al. |
| 2009/0267238 A1 | 10/2009 | Joseph et al. |
| 2010/0019349 A1 | 1/2010 | Oladeji et al. |
| 2010/0025081 A1 | 2/2010 | Arai et al. |
| 2010/0084761 A1 | 4/2010 | Shinagawa |
| 2010/0118465 A1* | 5/2010 | Onishi .................... H01G 4/01 361/271 |
| 2010/0164062 A1 | 7/2010 | Wang et al. |
| 2010/0224980 A1 | 9/2010 | Chahal |
| 2010/0230797 A1 | 9/2010 | Honda |
| 2010/0230806 A1 | 9/2010 | Huang et al. |
| 2010/0244189 A1 | 9/2010 | Klootwijk et al. |
| 2010/0276799 A1 | 11/2010 | Heng et al. |
| 2010/0316911 A1 | 12/2010 | Tesson et al. |
| 2011/0027967 A1 | 2/2011 | Beyne et al. |
| 2011/0089477 A1* | 4/2011 | Wernersson .......... B82Y 10/00 257/312 |
| 2011/0221072 A1 | 9/2011 | Chin |
| 2011/0287606 A1 | 11/2011 | Brun et al. |
| 2011/0291166 A1 | 12/2011 | Booth, Jr. et al. |
| 2011/0291263 A1 | 12/2011 | West |
| 2012/0056316 A1 | 3/2012 | Pagaila |
| 2012/0061852 A1 | 3/2012 | Su et al. |
| 2012/0086135 A1 | 4/2012 | Thompson et al. |
| 2012/0091583 A1 | 4/2012 | Kawashita et al. |
| 2012/0101540 A1 | 4/2012 | O'Brien et al. |
| 2012/0106228 A1 | 5/2012 | Lee |
| 2012/0228778 A1 | 9/2012 | Kosenko et al. |
| 2012/0276733 A1 | 11/2012 | Saeki et al. |
| 2012/0295415 A1 | 11/2012 | Ono |
| 2012/0319300 A1 | 12/2012 | Kim |
| 2013/0010441 A1 | 1/2013 | Oganesian et al. |
| 2013/0014978 A1 | 1/2013 | Uzoh et al. |
| 2013/0046368 A1 | 2/2013 | Storey |
| 2013/0082383 A1 | 4/2013 | Aoya |
| 2013/0082399 A1 | 4/2013 | Kim et al. |
| 2013/0087917 A1 | 4/2013 | Jee et al. |
| 2013/0093075 A1 | 4/2013 | Liu et al. |
| 2013/0119527 A1 | 5/2013 | Luo et al. |
| 2013/0119528 A1 | 5/2013 | Groothuis et al. |
| 2013/0146991 A1 | 6/2013 | Otremba et al. |
| 2013/0161825 A1 | 6/2013 | Hsu et al. |
| 2013/0181354 A1 | 7/2013 | Khan et al. |
| 2013/0200533 A1 | 8/2013 | Chau et al. |
| 2013/0228898 A1 | 9/2013 | Ide |
| 2013/0241026 A1 | 9/2013 | Or-Bach et al. |
| 2013/0267046 A1 | 10/2013 | Or-Bach et al. |
| 2013/0270660 A1 | 10/2013 | Bryzek et al. |
| 2013/0292840 A1 | 11/2013 | Shoemaker et al. |
| 2013/0313680 A1 | 11/2013 | Oganesian et al. |
| 2013/0313716 A1 | 11/2013 | Mohammed |
| 2014/0015548 A1* | 1/2014 | Naughton ............... G01R 27/26 324/658 |
| 2014/0036454 A1 | 2/2014 | Caskey et al. |
| 2014/0061855 A1 | 3/2014 | Kuo et al. |
| 2014/0070380 A1 | 3/2014 | Chiu et al. |
| 2014/0092524 A1 | 4/2014 | Kim et al. |
| 2014/0124943 A1 | 5/2014 | Behrends et al. |
| 2014/0127875 A1 | 5/2014 | Behrends et al. |
| 2014/0138142 A1 | 5/2014 | Hu et al. |

(56) References Cited

U.S. PATENT DOCUMENTS

| | | | |
|---|---|---|---|
| 2014/0162449 | A1 | 6/2014 | An et al. |
| 2014/0332980 | A1 | 11/2014 | Sanders et al. |
| 2015/0357272 | A1 | 12/2015 | Shen et al. |

FOREIGN PATENT DOCUMENTS

| | | |
|---|---|---|
| WO | WO 2005/022630 | 3/2005 |
| WO | WO 2006/124597 A2 | 11/2006 |
| WO | WO 2007/142721 | 12/2007 |
| WO | WO 2009/070348 | 6/2009 |
| WO | WO 2012/169162 A1 | 12/2012 |
| WO | WO 2013/062533 A1 | 5/2013 |

OTHER PUBLICATIONS

Dr. Paul A. Magill, "A New Thermal-Management Paradigm for Power Devices," Power Electronics Technology, Nov. 2008, pp. 26-30.

Herming Chiueh et al., "A Dynamic Thermal Management Circuit for System-On-Chip Designs," Analog Integrated Circuits and Signal Processing, 36, pp. 175-181, Jan. 25, 2003.

Hybrid Memory Cube Consortium, "Hybrid Memory Cube Specification 1.0," Last Revision Jan. 2013, 122 pages, Retrieved from: http://hybridmemorycube.org/specification-download/.

K. Zoschke et al., "Hermetic Wafer Level Packaging of MEMS Components Using Through Silicon Via and Wafer to Wafer Bonding Technologies" (2013 Electronic Components & Technology Conference, IEEE, pp. 1500-1507).

Lau et al., "Thin-Wafer Handling with a Heat-Spreader Wafer for 2.5D/3D IC Integration," $46^{th}$ International Symposium on Microelectronics (IMAPS 2013) Sep. 30-Oct. 3, 2013, Orlando, FL USA, pp. 1-8 [389-396].

Li Shang et al., "Thermal Crisis: Challenges and Potential Solutions," Potentials, vol. 25, Issue 5, Sep./Oct. 2006, pp. 31-35.

Nakamura et al., "Technology Trends and Future History of Semiconductor Packaging Substrate Material," Hitachi Chemical Review Technical Report No. 55, May 2013, pp. 24-29.

Pulliam, Wayne, "Designing with BGAs," AMD presentation, 2008, 62 pages.

San Hwui Lee et al., "Wafer-to-Wafer Alignment for Three Dimensional Integration: A Review," Journal of Microelectromechanical Systems, vol. 20, Issue 4, Aug. 2011, pp. 885-898.

Dreiza; Moody et al., "Joint Project for Mechanical Qualification of Next Generation High Density Package-on-Package (PoP) with Through Mold Via Technology," Amkor Technology, EMPC2009—17th European Microelectronics & Packaging Conference, Jun. 16th, Rimini, Italy, 8 pages.

Zwenger; Curtis et al., "Next Generation Package-on Package (PoP) Platform with Through Mold Via (TMV™) Interconnection Technology," Amkor Technology, Originally published in the proceedings of the IMPAS Device Packaging Conference, Scottsdale, AZ, Mar. 10-12, 2009, 8 pages.

Density Package-on-Package (PoP) with Through Mold Via Technology, Amkor Technology, EMPC2009—17th European Microelectronics & Packaging Conference, Jun. 16th, Rimini, Italy, 8 pages.

Zwenger; Curtis et al., "Next Generation Package-on_Package (PoP) Platform with Through Mold Via (TMV™) Interconnection Technology," Amkor Technology, Originally published in the proceedings of the IMPAS Device Packaging Conference, Scottsdale, AZ, Mar. 10-12, 2009, 8 pages.

Kim; Jinseong et al., "Application of Through Mold Via (TMV) as PoP base package," Amkor Technology, 2008 IEEE Reprinted from ECTC2008 Proceedings, 6 pages.

U.S. Appl. No. 14/250,317 titled "Die Stacks With One or More Bond Via Arrays," filed Apr. 10, 2014, 58 pages.

Das; Rabindra N. et al., "Package-Interpose-Package (PIP) Technology for High End Electronics," Endicott Interconnect Technologies, Inc., retrieved Jul. 31, 2014, 4 pages.

McCormick; Heather et al., "Assembly and Reliability Assessment of Fine Pitch TMV Package on Package (PoP) Components," Amkor Technology Inc., Originally published in the Proceedings of the SMTA International Conference, San Diego, CA, Oct. 4-8, 2009, 8 pages.

U.S. Appl. No. 14/288,064 titled, "Integrated Circuit Assemblies With Reinforcement Frames, and Methods of Manufacture," filed May 27, 2014.

U.S. Appl. No. 14/328,380 titled, "Microelectronic Assemblies With Integrated Circuits and Interposers With Cavities, and Methods of Manufacture," filed Jul. 10, 2014.

International Search Report and Written Opinion, May 12, 2015, 11 pages, PCT Patent Application No. PCT/US2015/019609.

International Search Report and Written Opinion, Aug. 6, 2015, 10 pages, PCT Patent Application No. PCT/US2015/028172.

Turner et al., "Mechanics of direct wafer bonding", 2006, pp. 171-188, vol. 462, doi: 10.1098/rspa.2005.1571, Proceedings of the Royal Society A, London, United Kingdom.

United States Patent and Trademark Office, First Action Interview Pilot Program Pre-Interview Communication, Mail Date Oct. 22, 2014, for U.S. Appl. No. 14/214,365, filed Mar. 14, 2014.

Strandjord et al., "Bumping for WLCSP using Solder Ball Attach on electrolessss NiAu UBM", 2008, 29 pages, Pac Tech USA—Packaging Technologies, Inc., Santa Clara, California.

Boyle et al., "Epoxy Resins", 2001, pp. 78-89, vol. 21, ASM Handbook, Composites (ASM International).

U.S. Patent Application, "Interposers With Circuit Modules Encapsulated by Moldable Material in a Cavity, and Methods of Fabrication", filed Dec. 2, 2014, U.S. Appl. No. 14/558,462, 19 pages.

International Search Report and Written Opinion dated Dec. 15, 2015, received in PCT Application PCT/US2015/050395.

U.S. Appl. No. 14/268,899, filed May 2, 2014.

U.S. Appl. No. 14/214,365, filed Mar. 14, 2014.

U.S. Appl. No. 14/304,535, filed Jun. 13, 2014.

N.H. Khan et al., "Power Delivery Design for 3-D ICs Using Different Through-Silicon Via (TSV) Technologies", IEEE Transactions on Very Large Scale Integration (VLSI) Systems, vol. 19, No. 4, Apr. 2011.

Non-Final Office Action mailed Nov. 8, 2010, in U.S. Appl. No. 12/480,694.

S. Kose et al., "Distributed Power Network Co-Design with On-Chip Power Supplies and Decoupling Capacitors", $13^{th}$ International Workshop on System Level Interconnect Prediction (SLIP), 2011 (Retrieved from http://ieeexplore.ieee.org/xpl/login.jsp?tp=&arnumber=6135434&url=http%3A%2F%2Fieeexplore.ieee.org%2Fiel5%2F6125889%2F6135427%2F06135434.pdf%3Farnumber%3D6135434).

F. Roozeboom et al., "High-Density, Low-Loss MOS Capacitors for Integrated RF Decoupling", The International Journal of Microcircuits and Electronic Packaging, vol. 24, No. 3, Third Quarter, 2001.

U.S. Appl. No. 14/633,746, filed Feb. 27, 2015.

Yong Wang et al: "Recent development of high energy density polymers for dielectric capacitors", IEEE Transactions on Dielectrics and Electrical Insulation, IEEE Service Center, Piscataway, NJ, US, vol. 17, No. 4, Aug. 2010, pp. 1036-1042.

International Search Report and Written Opinion for PCT/US2015/035688 dated Apr. 22, 2016.

\* cited by examiner

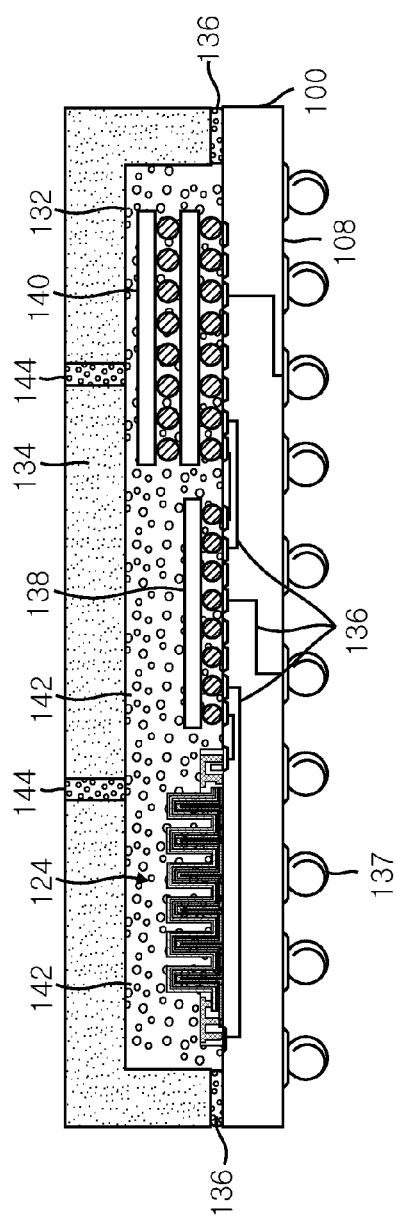
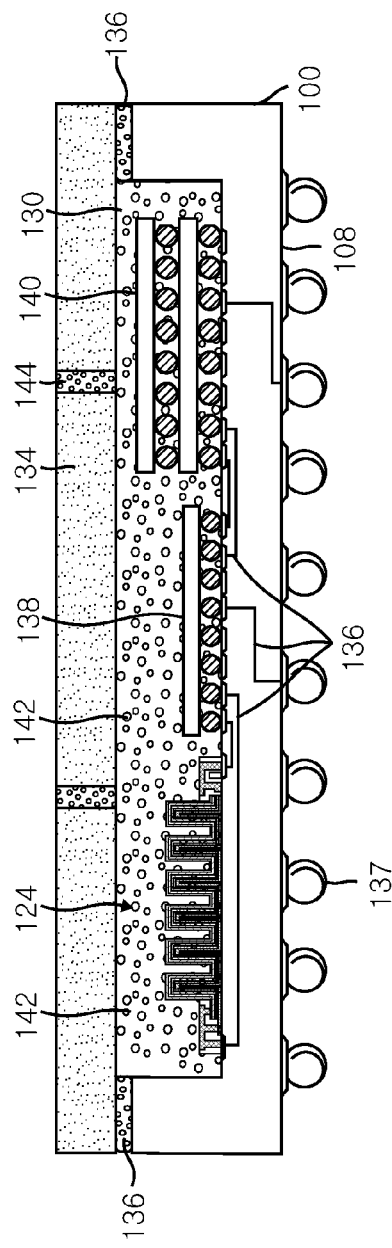
FIG. 5A
FIG. 5B

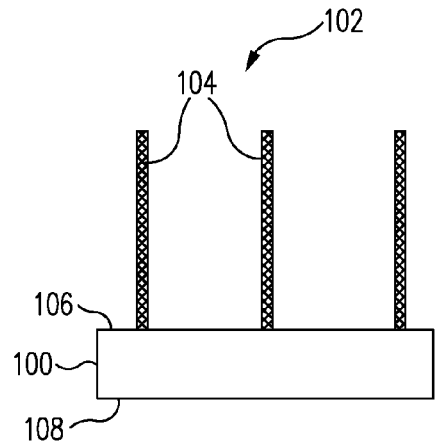
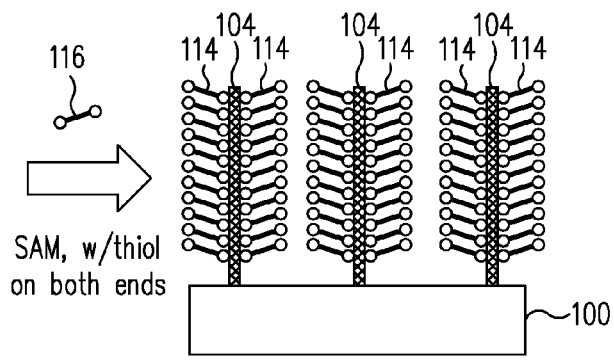
FIG. 6A    FIG. 6B
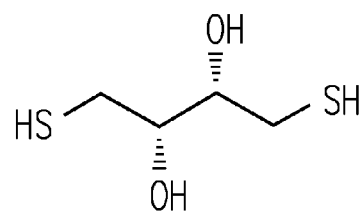
Dithiothreitol
FIG. 7A
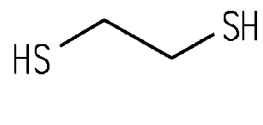
1,2-Ethanedithiol
FIG. 7B
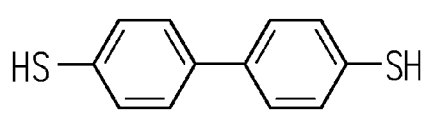
Biphenyl-4,4'-dithiol
FIG. 7C
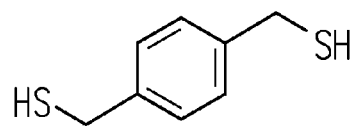
1,4-Benzenedimethanethiol
FIG. 7D

MAKING MULTILAYER 3D CAPACITORS USING ARRAYS OF UPSTANDING RODS OR RIDGES

BACKGROUND

1. Field of the Invention

This disclosure generally relates to methods for making integrated circuit components, and more particularly, to making three-dimensional (3D), metal-insulator-metal (MIM) capacitors upon or within associated substrates.

2. Related Art

MIM capacitors can be provided on semiconductor chips having active circuit elements, i.e., "active chips," or on passive chips containing passive circuit elements, such as capacitors, inductors, resistors, etc., for subsequent mounting to active chips.

Conventional capacitors made in, e.g., a silicon substrate, can be of two general types. A first type can be used, e.g., to store charge for each bit in a dynamic random access (DRAM) chip. A second type can be used for "decoupling" applications, wherein the primary focus has been on "planar" or so-called "two-dimensional" (2D) capacitors made on or in passive substrates and having very thin alternating dielectric and electroconductive layers, in single or multi-layer formats. Both types of capacitors can have limitations, e.g., low capacitance densities and low quality factors (i.e., efficiencies).

Methods for making capacitors in "blind" or "through" vias or trenches in substrates that overcome some of these drawbacks of the prior art are described in commonly owned U.S. Pat. No. 8,502,340 to V. Oganesian et al., the entire disclosure of which is incorporated herein by reference. These "three-dimensional" (3D) "via" or "trench" capacitors can achieve higher capacitances due to the relatively larger surface areas of their sidewalls, but can be difficult to coat with metal/dielectric layers with uniformly conformal coverage due primarily to limited mass transport into trenches or vias that are relatively deep and/or narrow.

Accordingly, a need exists for methods for making capacitors on or in associated substrates that achieve substantially higher capacitances than conventional 2D capacitors, but within which the MIM layers are substantially easier to form than in conventional via- or trench-type capacitors.

SUMMARY

In accordance with the present invention, novel methods are provided for making high-capacitance, 3D, multilayer or Metal-Insulator-Metal (MIM) capacitors on or in an associated substrate that overcome the above and other drawbacks of the prior art.

In one embodiment, a method for making a MIM capacitor comprises providing a substrate having a surface, forming an array of upstanding rods or ridges on the surface, depositing a first layer of an electroconductor on the surface and the array of rods or ridges, coating the first electroconductive layer with a layer of a dielectric, and depositing a second layer of an electroconductor on the dielectric layer. In some embodiments, the array of rods or ridges can comprise a photoresist material, and in others, multiple alternating electroconductive and dielectric layers can be formed.

In another embodiment, a method for making a capacitor comprises providing a substrate having a surface, depositing a first layer of an electroconductor on the surface, bonding an end of at least one upstanding metal wire to the first electroconductive layer, coating the first electroconductive layer and the at least one metal wire with a layer of a dielectric, and depositing a second layer of an electroconductor on the dielectric layer.

In yet another embodiment, the associated substrate can include a cavity, and the array of upstanding rods or ridges, and hence, the capacitor, can be formed such that it is disposed partially or completely within the cavity.

The scope of this invention is defined by the claims appended hereafter, which are incorporated into this section by reference. A more complete understanding of the features and advantages of the novel 3D MIM capacitors and the methods for making them will be afforded to those skilled in the art by a consideration of the detailed description of some example embodiments thereof presented below, especially if such consideration is made in conjunction with the appended drawings briefly described below, in which like reference numerals are used to identify like elements illustrated in one or more of the respective figures thereof.

BRIEF DESCRIPTION OF THE SEVERAL VIEWS OF THE DRAWINGS

FIG. 5A is a vertical cross-sectional view of the substrate and capacitor of FIG. 4A, showing the capacitor housed within a cavity of a second substrate and disposed adjacent to a pair of semiconductor packages;

FIG. 5B is a vertical cross-sectional view of the substrate and capacitor of FIG. 3H, showing the capacitor disposed on the floor of the cavity of the substrate and adjacent to a pair of semiconductor packages;

FIGS. 6A and 6B are vertical cross-sectional views of a portion of a substrate having an array of upstanding rods or ridges disposed thereon and illustrating the formation thereon of a self-assembled monolayer (SAM) of a dielectric comprising an alkanethiol having a thiol disposed at opposite ends thereof; and, FIGS. 7A-7D are molecular diagrams of four different alkanethiols useful for forming dielectric SAMs in accordance with the present invention.

DETAILED DESCRIPTION

This disclosure presents example embodiments of high-capacitance, multilayer, 3D MIM capacitors that are formed on or in an associated substrate, together with some example methods for making them.

Figure 1A:
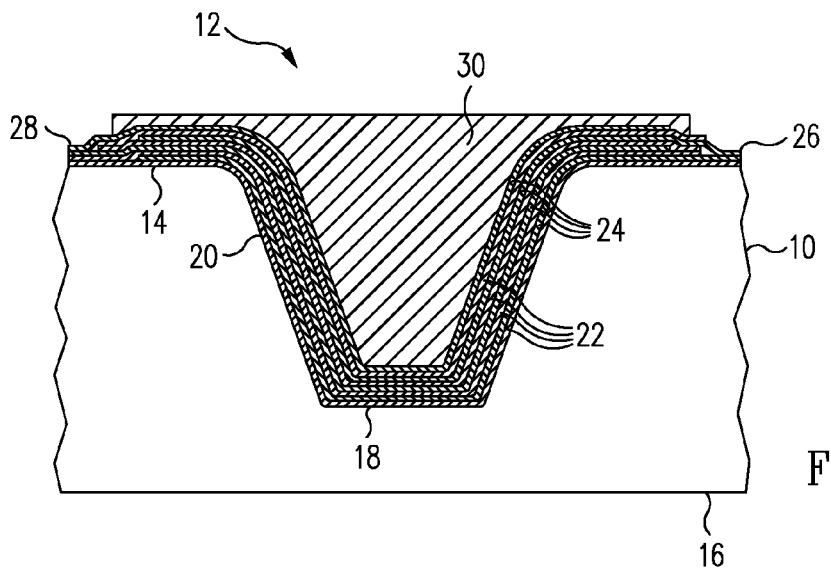
FIG. 1A is a vertical cross-sectional view of a portion of a substrate containing a blind via or trench capacitor.

FIG. 1A is a vertical cross-sectional view of a portion of a substrate 10 containing a "blind" via or trench capacitor 12 of a type disclosed in U.S. Pat. No. 8,502,340 referenced above. As illustrated in FIG. 1A, the substrate 10 itself includes generally planar, parallel upper and lower surfaces 14 and 16, and can be comprised of a semiconductor, such as silicon, glass, ceramic, polytetrafluoroethylene (PTFE), a polymer, such as a polyimide or an epoxy (which can be reinforced with, e.g., glass or other fibers), or a rigid or flexible "interposer" of a known type that can include a redistribution layer (RDL). As illustrated in the embodiments of FIGS. 5A and 5B, the RDL 136 can comprise a plurality of electroconductive pads and traces and used for the redistribution of electrical signals within the substrate 10 and/or their conveyance to its lower surface 16, and can be disposed on one, the other, or both of the upper and lower surfaces 14, 16 of the substrate 10, or alternatively or additionally, partially or completely disposed within its thickness.

Figure 1B:
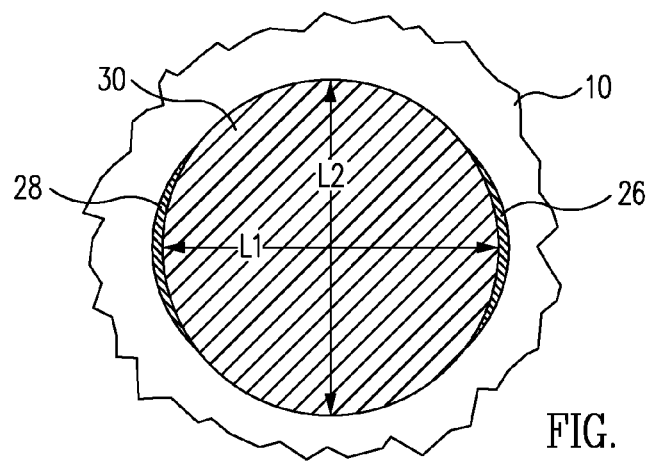
FIGS. 1B and 1C are top plan views of the substrate portion of FIG. 1A, wherein the capacitor therein is respectively shown as a via-type capacitor or a trench-type capacitor.
Figure 1C:
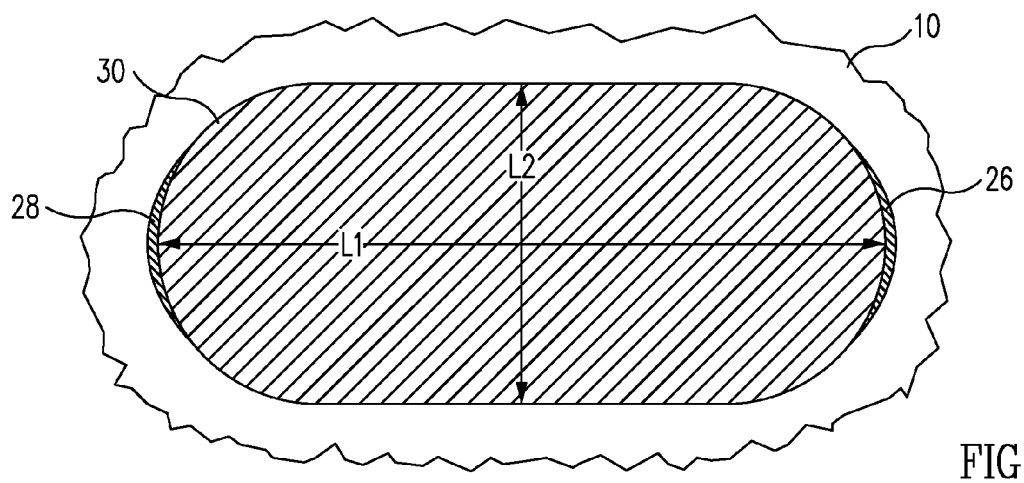

In the particular example embodiment illustrated in FIGS. 1A-1C, the capacitor 12 comprises a "blind" via-type MIM capacitor (as seen in FIG. 1B), or alternatively, a blind trench-type MIM capacitor (as seen in FIG. 1C), depending on whether the recess 18 within which the capacitor 12 is formed is generally round in cross-section, as illustrated in the top plan view of FIG. 1B, or horizontally elongated, as illustrated in the top plan view of FIG. 1C. Thus, in FIG. 1B, the width L2 of the recess 18 is about equal to its height L2, whereas, in FIG. 1C, the width L1 of the recess 18 is substantially greater than its height L2. Further, the recess 18 is referred to as a "blind" via or trench because the feature does not extend entirely through the thickness of the substrate 10. However, as described in the above-referenced patent, it is also possible to make "through" via- or trench-type capacitors 12 that extend through the entire thickness of the substrate 10.

Also, as can be seen in the particular example capacitor 12 of FIG. 1A, the side wall 20 of the recess 18 is tapered or flared inwardly with depth, which in the case of the via-type capacitor 12, gives the recess 18 a frusto-conical shape. However, as known to those of some skill in, e.g., the etching art, it is also possible to make recesses 18 that have substantially vertical side walls, or alternatively, that flare outwardly with depth, depending on the particular application at hand.

The capacitor 12 is referred to as a MIM capacitor because it includes at least one layer of an Insulator 22, or dielectric, sandwiched between at least two electroconductive, e.g., Metal, layers 24, which serve as the plates of the capacitor 12. As a practical matter, the number of alternating Insulator and Metal layers 22 and 24 that can be incorporated into the capacitor 12 to increase its capacitance is limited by the space available within the recess 18, i.e., width and/or depth, and the ability to coat its interior surfaces uniformly with the respective materials of the alternating layers. The particular example capacitor 12 illustrated in FIG. 1A includes four dielectric layers 22 and four electroconductive layers 24, but as indicated above, that number can vary.

A first one of the dielectric layers 22 serves to insulate a first one of the electroconductive layers 24 from the side wall 20 of the recess 18, and each of the three remaining dielectric layers 22 are respectively sandwiched between first and second, second and third, and third and fourth ones of the electroconductive layers 24. As illustrated in the particular embodiment of FIG. 1A, the first and third electroconductive layers 24 are tied together at the upper surface 14 of the substrate 10 in a first electroconductive pad 26 so as to define one "plate" and an interconnected "electrode" of the capacitor 12, whereas, the second and fourth electroconductive layers 24 are tied together at the opposite side of the upper surface 14 of the substrate 10 in a second electroconductive pad 28 so as to define the second plate and interconnected electrode of the capacitor 12. The remaining volume within the recess 18 can be filled with a dielectric "filler" material 30, e.g., epoxy, that serves to insulate and protect the fourth or innermost electroconductive layer 24 from ambient influences.

As discussed above, the 3D via or trench capacitor 12 fabricated in the thickness of the substrate 10 achieves an advantage over a conventional planar 2D capacitor formed on or in the substrate 10 by including a third dimension, viz., height, in the computation of the area of the MIM layers of the capacitor. Thus, 2D capacitors have a capacitance that is a function of their planar length times their planar width. All other factors remaining the same, the capacitance of 3D capacitors such as the above is a function of their planar length times their planar width times their vertical height, as measured in the direction of the thickness of the substrate 10. That is, the tapered side wall(s) 24 of the recess 18 upon which the MIM layers 22 and 24 are disposed serve to substantially increase the area of the layers 22, 24, and hence, the capacitance of such devices, relative to those of conventional 2D capacitors.

While 3D via or trench capacitors can achieve higher capacitances due to the relatively larger surface areas of their side walls, in some instances in which the vias or trenches are especially narrow and/or deep, their walls can be difficult to coat with uniform or conformal coats of the metal/dielectric layers due to limited mass transport into the depths of the narrow/deep vias or trenches. A need therefore exists for methods for making 3D multilayer MIM capacitors on or in associated substrates that achieve substantially higher capacitances than conventional 2D capacitors, but within which conformal MIM layers are easier to create than in conventional via- or trench-type capacitors. Following is a description of some example embodiments of such capacitors, along with some example methods and materials for making them, in which the "negative" features, i.e., the vias or trenches upon which the alternating dielectric and electroconductive layers are deposited, are "reversed," or transformed into "positive," upstanding features that are substantially easier to coat with such layers.

Figure 2A:
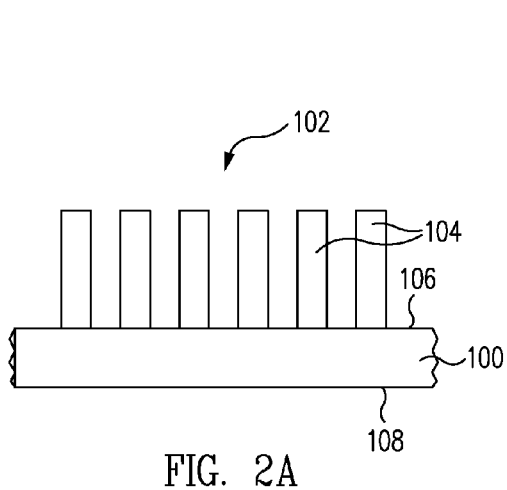
FIG. 2A is a vertical cross-sectional view of a portion of a substrate having an array of upstanding rods or ridges disposed thereon in accordance with an example embodiment of the present invention.
Figure 2B:
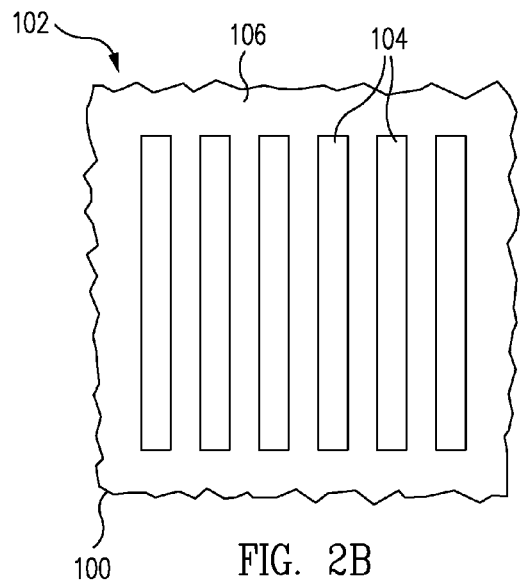
FIGS. 2B-2D are top plan views of the substrate portion of FIG. 2A, wherein the array disposed there is respectively shown as comprising an array of ridges, each having a generally rectangular cross-section, an array of rods, each having a generally square or rectangular cross-section, or an array of wires, having a generally round cross-section.
Figure 2C:
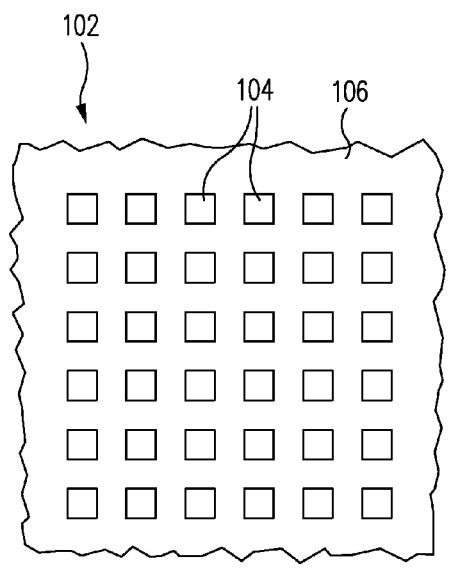
Figure 2D:
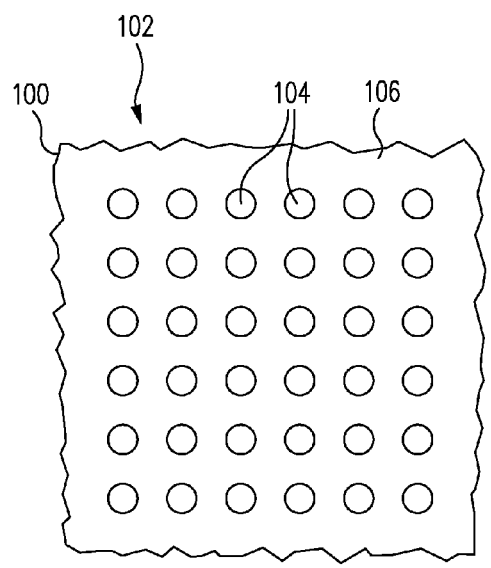

FIG. 2A is a vertical cross-sectional view of a portion of a substrate 100 having an array 102 of upstanding structures, viz., "rods" or "ridges" 104, disposed thereon in accordance with an example embodiment of the present invention, and FIGS. 2B-2C are alternative top plan views of the substrate portion of FIG. 2A, wherein the array 102 is respectively shown as comprising an array of upstanding ridges 104 (FIG. 2B), each having a generally rectangular horizontal cross-section, an array of upstanding rods 104 (FIG. 2C), each having a generally square or rectangular horizontal cross-section, or an array of upstanding wires (FIG. 2D), each having a generally circular horizontal cross-section, such as might be present in a "wire bond" embodiment described in more detail below. The array 102 forms the foundation of a multilayer, 3D, MIM capacitor 124 (see FIGS. 3F-3H) that is constructed on the array 104 in the manner described below using well-known photolithography and integrated circuit (IC) fabrication techniques and apparatus.

As in the via or trench capacitor example above, the substrate 100 can include generally parallel and planar upper and lower surfaces 106 and 108 and can comprise a relatively wide variety of materials, e.g., a semiconductor, such as silicon, glass, ceramic, polytetrafluoroethylene (PTFE), a polymer, such as a polyimide or an epoxy (which may or may not be reinforced with, e.g., glass or other fibers), or a rigid or flexible interposer which might or might not include an RDL.

As those of some skill will understand, the primary function of the upstanding structures 104 of the array 102 is to increase the height, i.e., the vertical or Z dimension, and hence, the area of the MIM layers of the capacitor 124 formed thereon, without increasing its "footprint," i.e., its horizontal X and Y dimensions, on the surface 106 of the substrate 100. In this regard, in the particular example embodiment of FIGS. 2A-2D, the array 100 is illustrated as being a square or rectangular array. However, it should be understood that the array 100 can take other shapes, e.g., circular, elliptical, polygonal, and the like, depending on the particular application at hand. Similarly, while the horizontal cross-sectional shapes of the rods or ridges 104 are illustrated as being square, rectangular, or circular, these shapes can also be easily varied, again depending on the problem being addressed.

Additionally, it is desirable in general to maximize both the number of the features 104 and their "aspect ratio" (AR), defined herein as the height or Z dimension of the feature 104 divided by the smaller of its horizontal or X/Y dimensions, and hence, the surface area, of the upstanding rods or ridges 104, but consistent with their retaining adequate columnar stability. It has been discovered that rods or ridges 104 comprising a photoresist material can be made reliably with a smaller cross-sectional dimension of about 5 μm ($5\times10^{-6}$ meters) and with a vertical dimension or height of between about 100 μm and 500 μm, i.e., with an AR of between about 20 to 1 and 100 to 1, and that they can disposed at a pitch of about 10 μm, i.e., with a spacing of about 5 μm between adjacent rods or ridges 104, to form an array 102.

A similar situation obtains in a "wire bond" arrangement, i.e., one in which the rods 104 of the array 102 can comprise conventional bonded metal wires of a type used to interconnect stacked or so-called "Package-on-Package" (PoP) integrated circuit (IC) packages in which a "Bond Via Array" (BVA), i.e., an array of relatively stiff, upstanding bonded metal wires, each having a lower end bonded to a surface of a substrate and a free-standing opposite upper end, is used to electroconductively interconnect a first IC package stacked on top of a second IC package. Examples of such BVAs can be found in, e.g., commonly owned U.S. Pat. No. 8,404,520 to E. Chau et al.; and U.S. Pat. Pub. Nos. 2013/0313716 A1 by I. Mohammed, 2014/0036454 A1 by T. Caskey et al., and 2013/0200533 by E. Chau et al., the entire disclosure of each of which is incorporated herein by reference.

Using such BVA techniques, arrays 102 can be confected that comprise generally cylindrical wire-bonding wires, each having a diameter of about 50 μm and a vertical dimension or height of about 500 μm, i.e., an AR of about 10 to 1, and that are disposed at a pitch of about 200-240 μm, i.e., with a spacing of 150-190 μm between adjacent wires, with repeatable reliability. The wires 104 can comprise, for example, gold (Au), copper (Cu) or aluminum (Al), can have other cross-sectional shapes, e.g., polygonal, and can be coated or plated with another metal, such as palladium (Pd), which has a higher modulus of elasticity than the foregoing "core" materials and thereby renders them stiffer in the vertical direction.

Figure 3A:
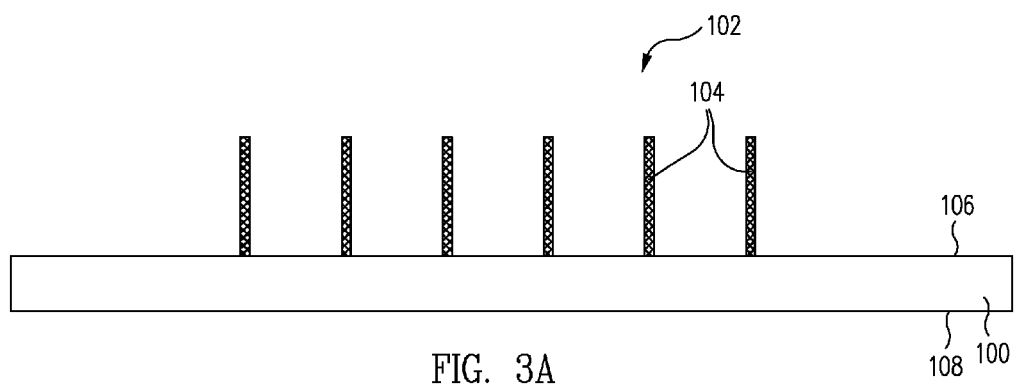
FIGS. 3A-3F are vertical cross-sectional views of a portion of a substrate respectively illustrating sequential steps of an example embodiment of a method for making a multilayer, 3D capacitor on a surface of the substrate in accordance with the present invention.

FIGS. 3A-3F are vertical cross-sectional views of the substrate 100 respectively illustrating sequential steps of an example embodiment of a method for making a capacitor on the surface 106 of the substrate 100 in accordance with the present invention. As illustrated in FIG. 3A, the first step of the method involves forming an array 104 comprising at least one rod or ridge 104 on the upper surface 106 of the substrate 100. In one "photoresist" embodiment, this comprises coating the surface of the substrate with a photoresist material, e.g., by spin coating, photopatterning the photoresist to define the at least one upstanding rod or ridge 104 therein, and stripping the excess photoresist from the surface 106 of the substrate 100 so as to leave the at least one rod or ridge 106 upstanding thereon. Thus, in FIG. 3A, the array 102 can comprise a plurality of rods or ridges 104 made of a photoresist material and having, for example, the number and shape of the upstanding features 104 illustrated in the top plan views of FIGS. 2B-2D. The photoresist material can comprise, for example, Benzocyclobutene (BCB), polyimide, spun-on glass, or SU-8, all of which are dielectrics.

Figure 3B:
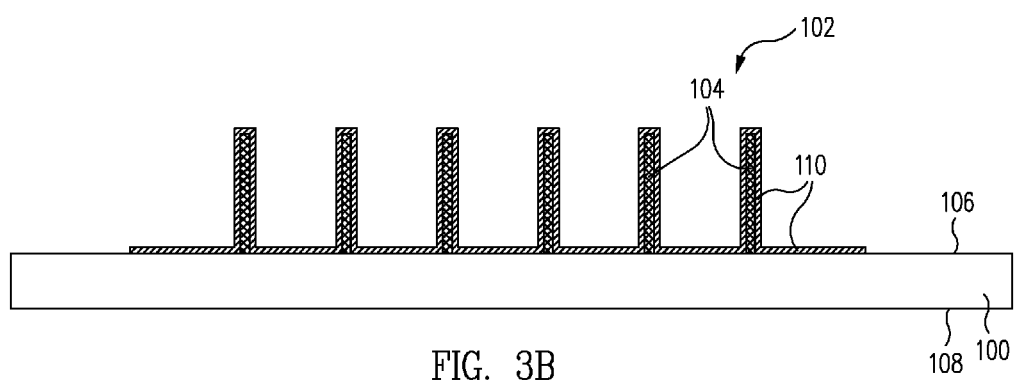

Accordingly, as illustrated in FIG. 3B, the next step of the method comprises depositing a first layer 110 of an electroconductor, e.g., a metal, on the surfaces 106 of the substrate 100 and the at least one rod or ridge 104 to at least partially define one of the plates of the capacitor 124. The layer 110 of electroconductor can comprise, for example, Tantalum (Ta), Copper (Cu), Titanium (Ti), Titanium Nitride (TiN), Silver (Ag), Gold (Au), or Palladium (Pd), and can be deposited using a variety of known techniques, including, for example, atomic layer deposition (ALD), chemical vapor deposition (CVD) or sputtering. As those of some skill in this art will understand, the deposition of the first and subsequent layers of electroconductive and dielectric materials into the open space above the array 102 of rods or ridges 104 is relatively free of limits on mass transport, compared to that in the example via or trench capacitor described above.

Figure 3C:
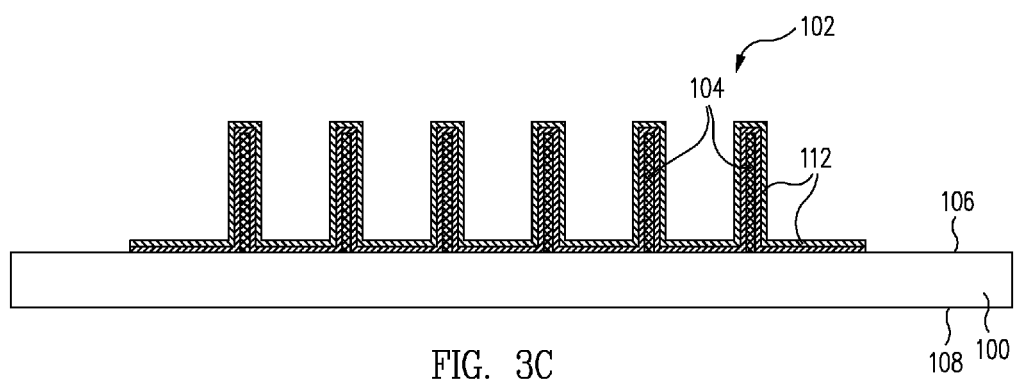

As illustrated in FIG. 3C, the first electroconductive layer 110 is then conformally coated with a thin but uniform first layer 112 of a dielectric. In this regard, it is desirable that the dielectric material have a relatively high dielectric constant, k. Suitable dielectric materials that can be coated on the electroconductor layer 110 using, for example, ALD, CVD or sputtering, include hafnium oxide ($HfO_2$) (k=25), tantalum pentoxide ($Ta_2O_5$) (k=22), zirconium dioxide ($ZrO_2$) (k=25), yttrium oxide ($Y_2O_3$) (k=15), lanthanum oxide ($La_2O_3$) (k=30), titanium dioxide ($TiO_2$) (k=80), strontium titanate ($SrTiO_3$) (k=2,000), or Parylene (k≈3), which can be vapor phase deposited on the first electroconductive layer 110.

As illustrated in FIGS. 6A and 6B, in another embodiment, the first dielectric layer 112 can comprise a "self-assembled monolayer" (SAM) 114 comprising molecules 116 containing at least one thiol group, and preferably, alkanethiol molecules 116 having a thiol group at both ends thereof, such as illustrated in the molecular diagrams of FIGS. 7A-7D. These compounds can include, for example, molecules of Dithiothreitol ($C_4H_{10}OS_2$), 1,2-Ethanedithiol ($C_2H_4(SH)_2$), Biphenyl-4,4'-dithiol ($HSC_6H_4SH$), or 1,4-Benzenedimethanethiol ($C_6H_4(CH_2SH)_2$).

Self-assembly is a process in which a disordered system, typically a liquid solution of molecules, forms an organized structure or pattern, in this case, an extremely thin but uniform, defect-free "monolayer" on the electroconductive layers of the capacitor, as a consequence of specific, local interactions among the components themselves, without any external direction. Discussions of such self-assembled monolayers and techniques for making them can be found in, e.g., "Self-assembled Monolayers of Thiols and Dithiols on Gold," *Chem. Soc. Rev.*, 2010, 39, 1805-1834, and "Self-Assembled Monolayers of and Multilayers of Conjugated Thiols, a,o-Dithiols, and Thioacetyl-Containing Adsorbates. Understanding Attachments between Potential Molecular Wires and Gold Surfaces," *J. Am. Chem. Soc.*, 1995, 117, 9529-9534, the teachings of which are incorporated herein by reference. Use of these techniques enable the formation of a uniform, defect-free and "super-thin" dielectric layers, which can be used for any of the dielectric layers described herein and which can result in capacitors exhibiting ultra-high capacitances.

Figure 3D:
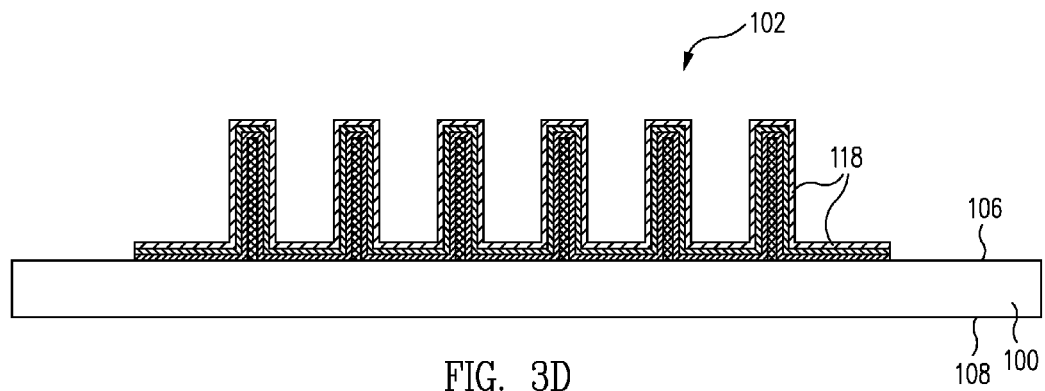
Figure 3E:
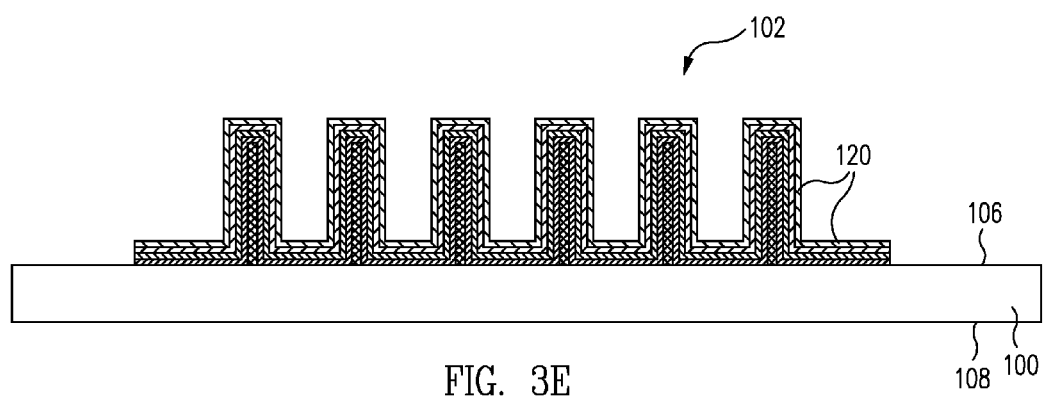
Figure 3F:
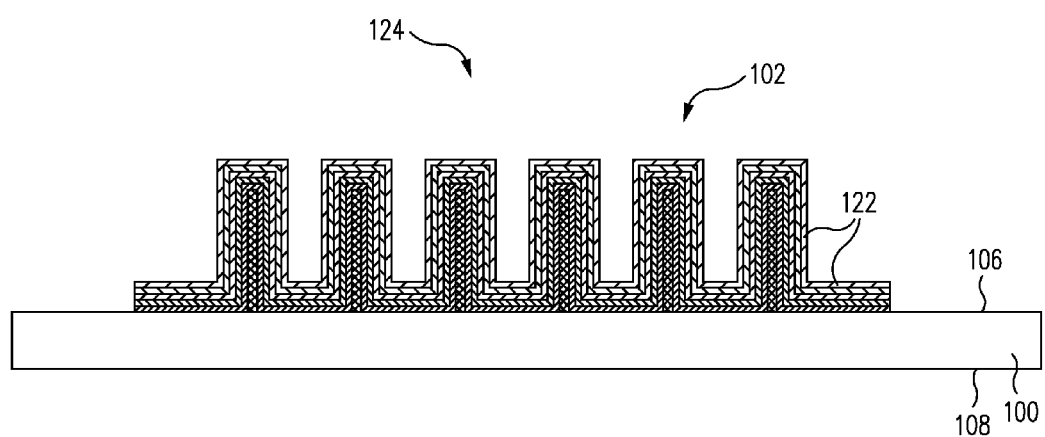

As illustrated in FIGS. 3D-3F, the first dielectric layer 112 is followed by the deposition of alternating electroconductive and dielectric layers over the array 102 until the desired number of alternating layers of the resulting capacitor 124 has been reached. In the particular embodiment illustrated in FIG. 3F, the capacitor 124 includes two dielectric layers 112, 120, and three electroconductive layers 110, 118 and 122, wherein the first dielectric layer 112 is sandwiched between the first and second electroconductive layers 110 and 118, and the second dielectric layer 120 is sandwiched between the second and third electroconductive layers 118 and 122. As discussed above, within practical limits, the number of alternating dielectric and electroconductive layers formed in the capacitor can vary widely.

As discussed above in connection with the via- and trench-type capacitors, it is desirable to create leads or electrodes respectively coupled to the two "plates" of the capacitor 124 for electroconductively interconnecting it with other circuit elements. In the particular example embodiment illustrated in FIGS. 3G and 3H, one of the contacting electrodes 126 of the capacitor 124 is electroconductively coupled to the second electroconductive layer 118, or a first "plate," of the capacitor 124, and the other electrode 126 is electroconductively coupled to the first and third electroconductive layers 110, 122, or second plate, of the capacitor 124. In only one of many possible embodiments, the electrodes 126 illustrated can be made by depositing a dielectric material 128, such as BCB, polyimide, spin-on glass or SUB, on the upper surface 106 of the substrate in the region where the electrodes 126 are to be formed, and then photopatterning the dielectric material, etching an opening through it down to the electroconductive layer(s) to which the electrodes 126 are to be respectively connected, and then depositing a metal in the openings to define the electrodes 126 and electroconductively couple them to the corresponding electroconductive layers. Of course, other methods of locating, forming and coupling electrodes to the plates of the capacitor can also be used.

A method for making a capacitor 124 on the substrate 100 using the BVA techniques discussed above in which the array 102 comprises one or more upstanding bonded metal wires 104, each having a lower end bonded to a surface of a substrate and a free-standing opposite upper end, is substantially similar to that described above in connection with FIGS. 3A-3H and the photoresist structures, but with the following notable difference.

In order to bond the lower ends of the wires 104 to the upper surface 106 of the substrate 100 using, e.g., a molten "ball"-type bond or an ultrasonic "stitch" or "wedge" type bond, it is desirable to first coat the upper surface 106 of the substrate 100 in the area where the array 102, and hence, the capacitor 124, are to be formed with a metal that is compatible with the metal of the wire bonds, e.g., an alloy of Au, Cu or Al, so that the wires can be reliably bonded to that surface. Further, since both the wires 104 and the metallized area of the substrate surface to which they are bonded are metal, i.e., electroconductive, this is sufficient to define one of the electroconductive layers, e.g., 110 of the capacitor 124 being constructed without the necessity of depositing another electroconductive layer upon them, and such that the next step in the construction of the capacitor 124 after the definition of the array 102 can commence with the coating of the surface 106 and upstanding wires 104 with a dielectric layer. After that, the steps of the method are substantially the same as in the photoresist array 102 method described above.

Figure 8:
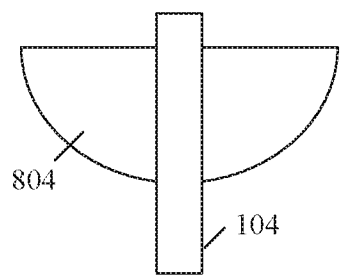
FIG. 8 illustrates a stage in a method of forming a metal wire segment prior to bonding the wire segment to a conductive element according to an embodiment of the invention.

The formation of the wire bonds includes joining a supply of metal wire 104 (FIG. 8) to surface 106 to form a base of the wire bond, and feeding a predetermined length of the wire supply out of a capillary 804 of a bonding tool. The wire segment 104 is then severed from the wire supply.

Comparison of Capacitance of 2D and 3D Capacitors

For illustration purposes, the following is a comparison of the respective capacitances of an example 3D capacitor 124 made in accordance with the methods of the present invention and a 2D capacitor having the same length, width, thickness and number of alternating dielectric and electroconductive layers. In the example 3D capacitor, the array 102 is assumed to be made of SU8 photoresist, to be 1 mm ($1 \times 10^{-3}$ meters) square, and to comprise 10,000 upstanding cylindrical rods 104, each having a diameter of 5 µm, a height of 100 µm, and a center-to-center pitch of 10 µm.

The dielectric layers of both the 2D and 3D capacitors is assumed to have a thickness of 5 nm ($5 \times 10^{-9}$ meters) and a dielectric constant k=25 (e.g., $HfO_2$), the electroconductive layers of both capacitors is assumed to be the same metal and thickness, and it is assumed that there are two alternating dielectric and electroconductive layers in both capacitors.

For the planar or conventional 2D capacitor, the capacitance=$8.85 \times 10^{-12}$ Farads/meter (F/m)$\times 25 \times 1$ mm$^2$/5 nm=44.25 nF.

For the 3D capacitor in accordance with the present invention, the capacitance=$2 \times 8.85 \times 10^{-12}$ F/m$\times 25 \times (1$ mm$^2$+10,000$\times 3.14 \times 0.005 \times 1$ mm$^2$)/5 nm=1.48 µF.

Thus, the 3D capacitor in accordance with the present invention has about 33 times the capacitance of the conventional planar or 2D capacitor, i.e., 1.48 µF/mm$^2$ vs. 44.25 nF/mm$^2$ for the latter, yet occupies the same 2D space on or in the associated substrate as the latter.

Figure 3G:
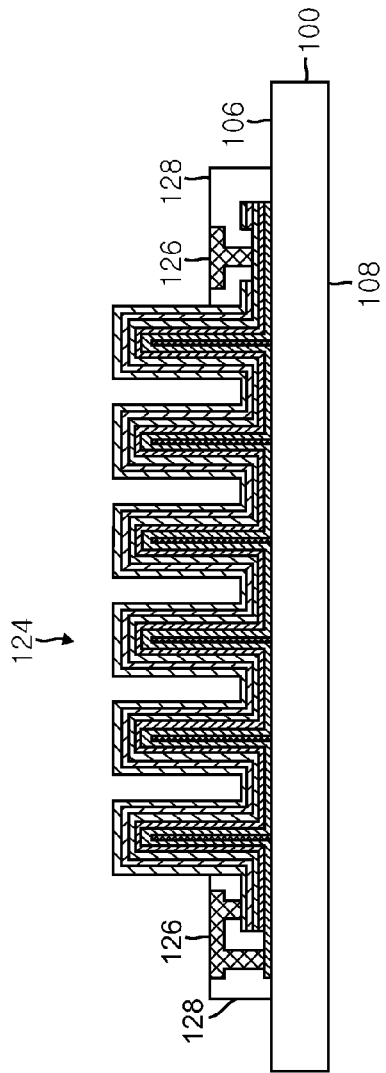
FIGS. 3G and 3H are vertical cross-sectional views of the substrate portion of FIGS. 3A-3F illustrating the capacitor made therein respectively disposed on a surface of the substrate or on the floor of a cavity in the substrate.
Figure 3H:
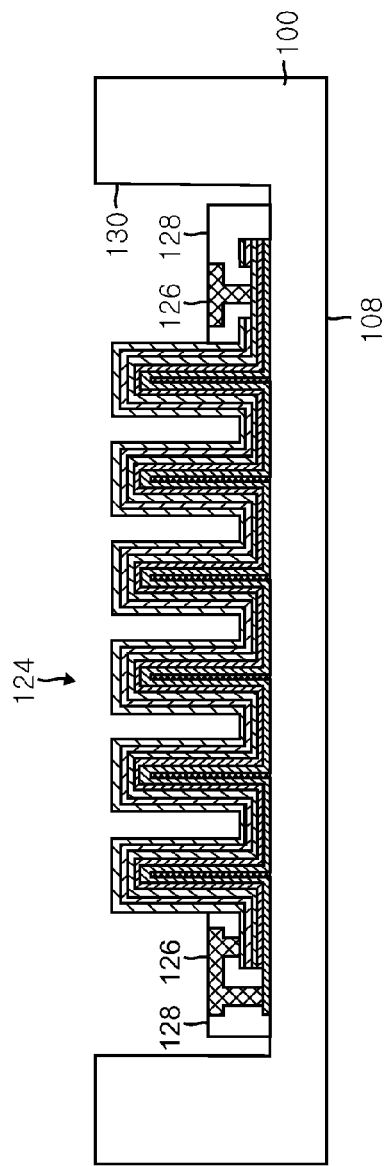
Figure 4A:
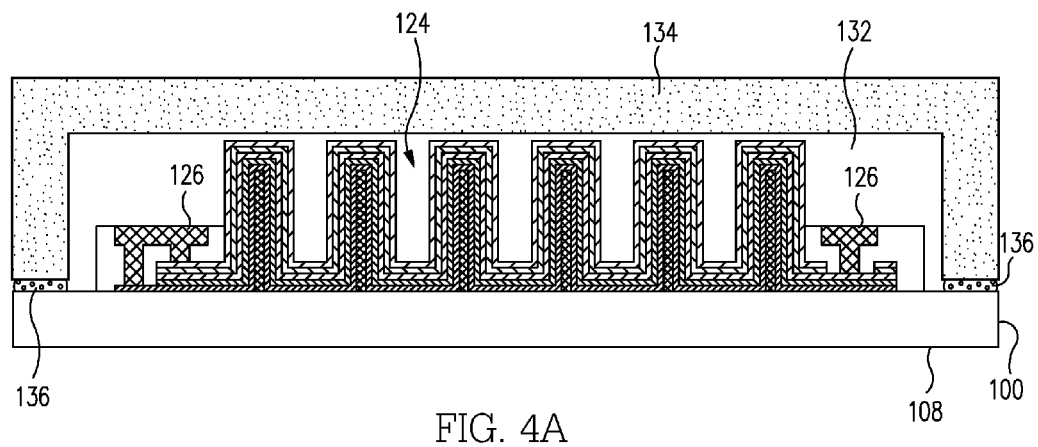
FIG. 4A is a vertical cross-sectional view of the substrate and capacitor of FIG. 3G, showing the capacitor housed within a cavity of a second substrate such as a handle wafer.

As further illustrated in FIGS. 3G and 3H, the capacitor 124 can be formed on the upper surface 106 of the associated substrate 100 (FIG. 3G), or alternatively, on the floor of a cavity 130 in the substrate 100 (FIG. 3H), such that the capacitor 124 is disposed partially or entirely within the cavity 130. As illustrated in FIG. 4A, it is possible to house a capacitor 124 made on the upper surface 106 of the substrate 100 within a cavity 132 that is contained in a second substrate 134, such as a "handle wafer" that is subsequently bonded to the substrate 100 in, e.g., a metal-to-metal or adhesive bond 136.

Figure 4B:
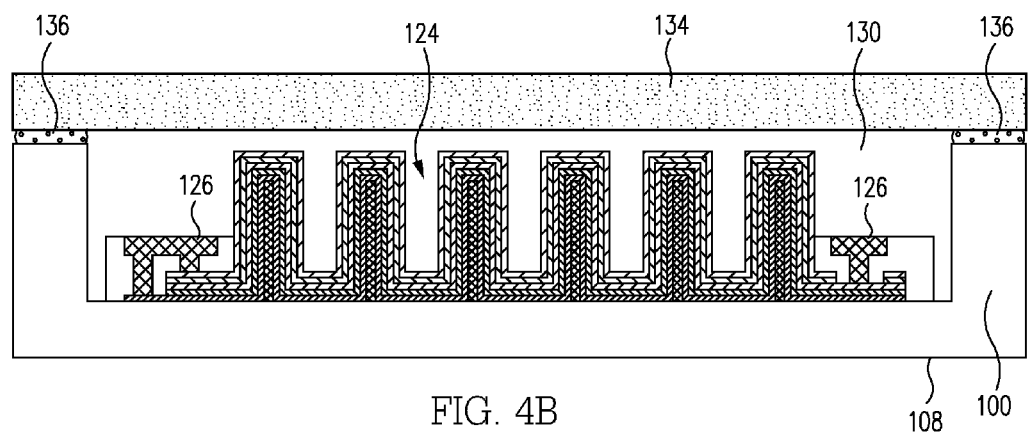
FIG. 4B is a vertical cross-sectional view of the substrate and capacitor of FIG. 3H, showing the capacitor disposed on the floor of the cavity of the substrate and covered over by a second substrate, such as a handle wafer.

As illustrated in FIG. 4B, if the capacitor 124 is contained entirely within a cavity 130 of the associated substrate 100, the capacitor 124 can be covered over with a second substrate 134, e.g., a handle wafer, without a corresponding cavity. Alternatively, the cavity 130 can be filled with an insulator, such as an epoxy resin, to protect and seal the capacitor 124 against, e.g., moisture. In either case, and whether a second wafer 134 is used or not, the space immediately above and surrounding the capacitor 124 can be overmolded with, e.g., a protective epoxy shell (not illustrated), to protect and insulate the exterior surface of the capacitor 124. Further, it might be desirable in such cases to modify the electrodes 126 such that their outer ends are exposed at a surface, e.g., of the lower surface, of the protective shell for convenient interconnect access, e.g., with an RDL 136, such as is illustrated in FIGS. 5A and 5B.

As discussed above in connection with FIGS. 4A and 4B, the capacitor 124 can be housed within a cavity 132 of a handle or a cover wafer 134, or alternatively, within a cavity 130 in the substrate 100, and in either case, the substrate 100 can comprise a redistribution layer (RDL) 136 comprising a plurality of electroconductive pads and interconnecting traces useful for, among others, electroconductively connecting the capacitor 124 to other components mounted on, e.g., the same or another substrate, and/or to solder bumps 137, used to electroconductively couple the substrate 100 to an associated printed circuit board (PCB—not illustrated). For example, as illustrated in FIGS. 5A and 5B, the cavities 130, 132 can also be used to house associated integrated (IC) circuit packages 138 and 140, as described in, e.g., commonly owned U.S. patent application Ser. No. 14/214,365 by H. Shen et al., filed Mar. 14, 2014, Ser. No. 14/288,064 by R. Katkar et al., filed May 27, 2014, and Ser. No. 14/268,899 by L. Wang et al., filed May 2, 2014, the entire disclosure of each of which is incorporated herein by reference.

In the particular example embodiments of FIGS. 5A and 5B, the IC packages comprise a single "flip chip" package 138 disposed adjacent to and interconnected with the capacitor 124 and a second package 140 that comprises a pair of interconnected packages stacked on top of one another, which in turn, are connected to the IC package 128 or other components through the RDL 136. The stacked package 140 could comprise, for example, a "package-on-package" (PoP) embodiment of the types described in commonly owned U.S. Pat. Pubs. 2013/0200533 A1 by E. Chau et al., filed Mar. 12, 2013, 2014, 2014/0036454 A1 by T. Caskey et al., filed Mar. 12, 2013, and U.S. Pat. No. 8,404,520 B1 to E. Chau et al., issued Mar. 26, 2013, the entire disclosure of each of which is incorporated herein by reference. The capacitor 124 could function, for example, as a decoupling capacitor connected between the power and ground terminals of the IC 138 to filter out power supply noise or to provide a charge reservoir for power consumption variations and reduce parasitic inductances. However, as those of some skill will understand, the type, number and function of IC packages disposed within the cavities 130, 142 along with the capacitor 124 can vary, depending on the particular application at hand.

As further illustrated in FIGS. 5A and 5B and discussed above, in some embodiments, it can be desirable to fill the empty spaces within the cavities 130, 132 with an appropriate filler 142, such as an epoxy or a thermal interface material, to reinforce the mounting of the capacitor 124 and the IC packages 138, 140 and/or to provide an enhanced heat transfer path between the dies to the surrounding ambient. As illustrated in FIGS. 5A and 5B, in one possible embodiment, this can be effected by forming one or more channels 144 in the handle wafer 134 that communicate between the cavities 130, 132 and an exterior surface of the handle wafer 134, e.g., the upper surface thereof, and then injecting the filler 142 into the cavities through the channels 144.

From the foregoing description, it will by now be clear to those of some skill in this art that many modifications, substitutions and variations can be made in and to the materials and configurations of the high-capacity, multilayer MIM capacitors of the present invention, together with the methods for forming them on or within a cavity of an associated substrate, and in light thereof, that the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A method for making a capacitor, the method comprising:
   providing a substrate having a surface;
   depositing a first electroconductive layer on the surface;
   bonding an end of at least one upstanding wire to the first electroconductive layer by a first bond comprising at least one of a molten ball bond and an ultrasonic bond;
   coating the first electroconductive layer and the at least one wire with a dielectric layer, which comprises at least part of capacitor dielectric for the capacitor; and
   depositing a second electroconductive layer on the dielectric layer, the second electroconductive layer comprising at least part of a first capacitor electrode for the capacitor.

2. The method of claim 1, wherein the bonding comprises bonding respective ends of an array of upstanding wires to the first electroconductive layer.

3. The method of claim 1, wherein the at least one wire comprises gold (Au), copper (Cu) or aluminum (Al).

4. The method of claim 1, wherein the first bond comprises a stitch bond.

5. The method of claim 1, wherein the first bond comprises a molten ball bond.

6. The method of claim 1 wherein the at least one wire comprises at least part of a second capacitor electrode for the capacitor.

7. The method of claim 1 wherein said bonding comprises, for the at least one wire:
   providing a supply of wire in a bonding tool, the supply of wire comprising the at least one wire exposed at an opening of a capillary of the bonding tool;
   bonding the at least one wire to the first electroconductive layer; and
   severing the at least one wire from the supply of wire.

8. A method for making a capacitor, the method comprising:
   providing a substrate having a surface;
   depositing a first electroconductive layer on the surface;
   bonding an end of at least one upstanding wire to the first electroconductive layer;
   coating the first electroconductive layer and the at least one wire with a dielectric layer; and
   depositing a second electroconductive layer on the dielectric layer;
   wherein the at least one wire comprises gold (Au), copper (Cu) or aluminum (Al); and
   wherein the at least one wire is plated with palladium (Pd).

9. A structure comprising:
   a surface;
   one or more first structures located on the surface, each first structure extending away from the surface, each first structure comprising:
   a wire bonded to the surface by a first bond comprising at least one of a molten ball bond and a stitch bond;

one or more dielectric features covering the wire, each dielectric feature comprising at least part of a capacitor dielectric for a capacitor; and one or more electroconductive layers each of which overlies at least one said dielectric layer and comprises at least part of a first capacitor electrode for the capacitor.

10. The structure of claim 9, wherein in at least one said first structure, the wire is bonded to the surface by the respective first bond comprising the stitch bond.

11. The structure of claim 9, wherein in at least one said first structure, the wire is bonded to the surface by the respective first bond comprising the molten ball bond.

12. The structure of claim 9 wherein in at least one said first structure, the wire comprises at least part of a second capacitor electrode for the capacitor.

13. The structure of claim 9 wherein the one or more first structures are a plurality of first structures.

14. A method for making a capacitor, the method comprising:

providing a first electroconductive layer;

providing a supply of wire comprising a portion exposed at an opening of a capillary of a bonding tool;

bonding the portion of the supply of wire to the first electroconductive layer to form a bond between the supply of wire and the first electroconductive layer;

severing a length of wire from the supply of wire, the length of wire being a wire bonded to the first electroconductive layer by the bond and comprising a longitudinal segment extending away from the bond and away from the first electroconductive layer;

coating the longitudinal segment with a dielectric which comprises at least part of a capacitor dielectric for the capacitor; and coating the dielectric with a second electroconductive layer, the second electroconductive layer comprising at least part of a first capacitor electrode for the capacitor.

15. The method of claim 14 wherein the wire comprises at least part of a second capacitor electrode for the capacitor.

* * * * *